Figure 5:
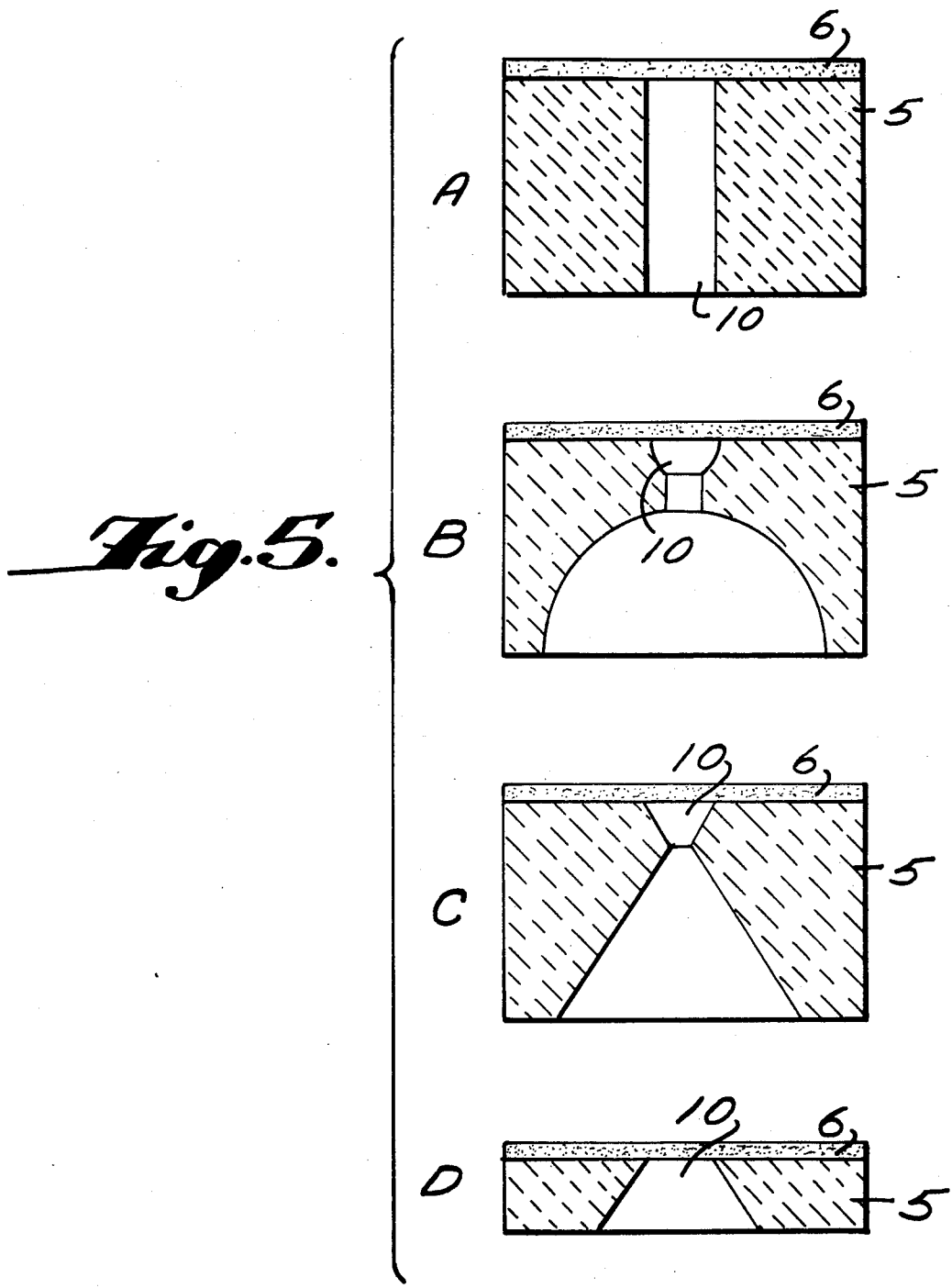

United States Patent [19]

Liddiard

[11] Patent Number: 4,574,263
[45] Date of Patent: Mar. 4, 1986

[54] INFRARED RADIATION DETECTOR

[75] Inventor: Kevin C. Liddiard, Fairview Park, Australia

[73] Assignee: The Commonwealth of Australia, Canberra, Australia

[21] Appl. No.: 742,365

[22] PCT Filed: Sep. 17, 1981

[86] PCT No.: PCT/AU81/00130
§ 371 Date: May 21, 1982
§ 102(e) Date: May 21, 1982

[87] PCT Pub. No.: WO82/01066
PCT Pub. Date: Apr. 1, 1982

Related U.S. Application Data

[63] Continuation of Ser. No. 387,852, May 21, 1982, abandoned.

[30] Foreign Application Priority Data

Sep. 24, 1980 [AU] Australia ............................. PE5725

[51] Int. Cl.⁴ ........................................... H01L 31/08
[52] U.S. Cl. ...................................... 338/18; 338/25; 250/338
[58] Field of Search ...................... 338/18, 25; 250/338

[56] References Cited

U.S. PATENT DOCUMENTS

| | | | |
|---|---|---|---|
| 2,423,476 | 7/1947 | Billings et al. | 338/18 X |
| 2,516,873 | 8/1950 | Havens et al. | 338/18 |
| 3,069,644 | 12/1962 | Eberhardt | 338/18 |
| 3,229,235 | 1/1966 | Bernath | 338/18 X |
| 3,693,011 | 9/1972 | De Vaux et al. | 250/338 |
| 3,715,288 | 2/1973 | Risgin | 204/38 A |
| 4,061,917 | 12/1977 | Gorauson et al. | 250/336.1 X |
| 4,224,520 | 9/1980 | Greene et al. | 338/18 X |
| 4,302,674 | 11/1981 | Adachi et al. | 250/338 |
| 4,349,808 | 9/1982 | Kraus | 338/18 |

OTHER PUBLICATIONS

Gosch, J. "Thin–Film Enhances Balometer's Sensitivity", *Electronics* Feb. 28, 1980 pp. 74–76.

Elliot, D. J., *Integrated Circuit Fabrication Technology*, McGraw Book Co. ©1982 pp. 18–21, 24–25, 32–33, and 259.

Coombe, R. A., *The Electrical Properties and Applications of Thin Films*, Sir Issac Pitman & Sons Ltd. ©1967 pp. 88, 133.

Bruck et al. in Electronics, vol. 51, No. 16, pp. 99 to 104, 1978.

*Primary Examiner*—C. L. Albritton
*Assistant Examiner*—M. M. Lateef
*Attorney, Agent, or Firm*—Cushman, Darby & Cushman

[57] ABSTRACT

An infrared radiation detector in which a stable substrate (5) has a hole (10) through it and a pair of bonding pads (9) on two opposite sides of the hole, the hole being covered by a pellicle (6) of insulating or semi-conductor material with supports over the hole, a detector element (7) comprising an ultrathin infrared absorbing film of nickel, palladium, platinum or iridium less than 10 nm thick or a gold film less than 20 nm thick, two sides of the detector element connecting to the bonding pads (9) by thin film contacts (8).

17 Claims, 5 Drawing Figures

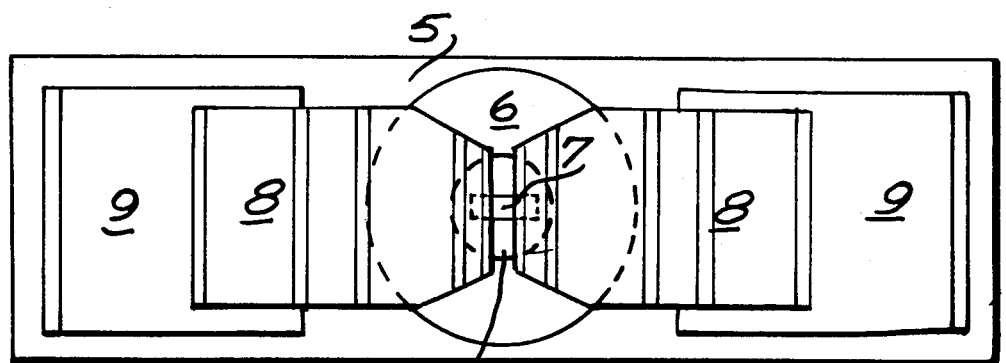
Fig. 1.
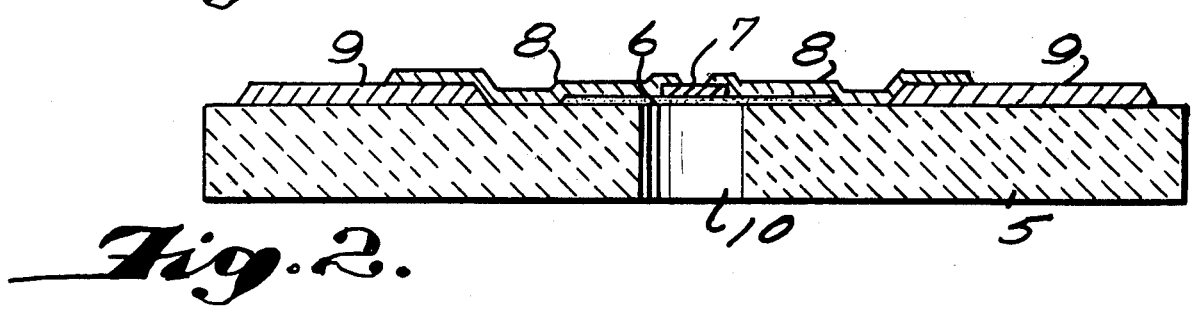
Fig. 2.
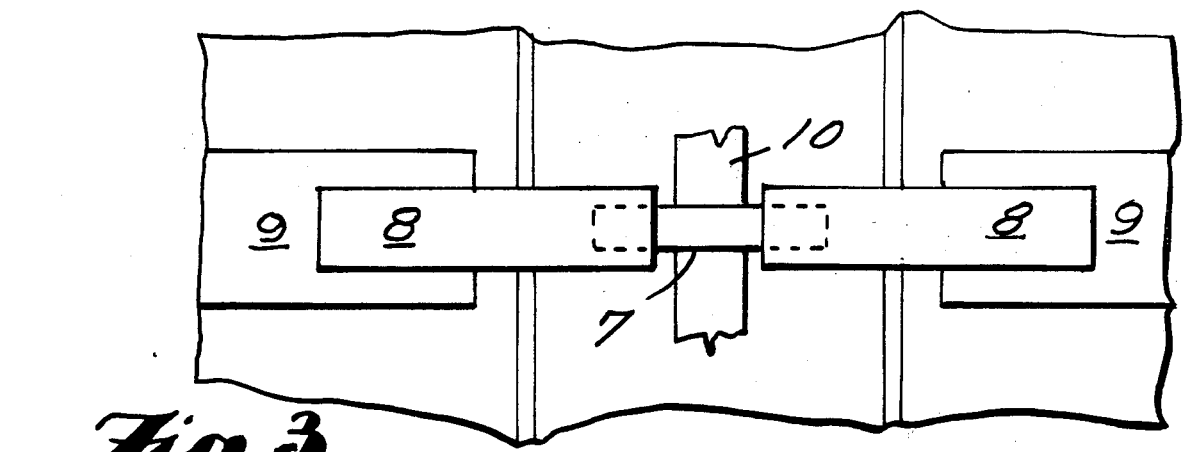
Fig. 3.
Fig. 4.
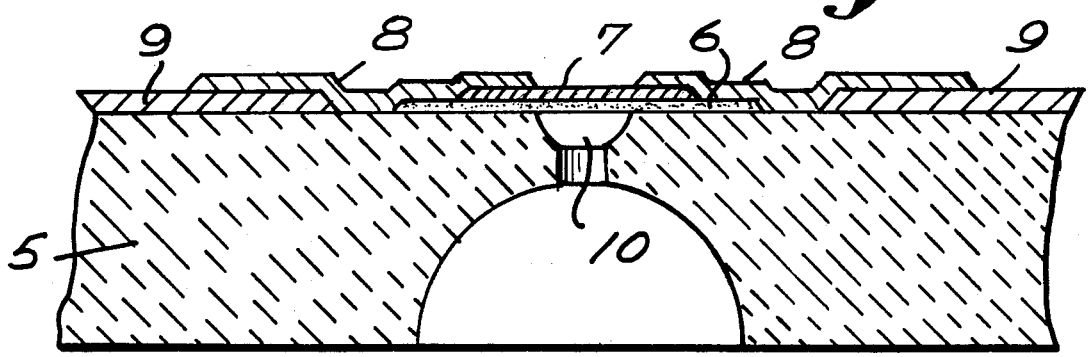

INFRARED RADIATION DETECTOR

This is a continuation of application Ser. No. 387,852, filed May 21, 1982, now abandoned.

This invention relates to a method of preparation of an improved high performance thermal infrared detector and to the detector construction itself.

According to the invention a single detector or array of detectors, used in conjunction with a suitable optical system, detects the infrared heat radiation emitted from bodies, but will also operate over a broad wavelength region, from the near to far infrared.

The detector is of the resistance bolometer type, that is absorbed infrared radiation raises the temperature of the detector, thereby causing the electrical resistance to change. This change is observed by virtue of the variation in an electrical bias current or voltage applied to the detector.

It must be understood that detectors of this type have been previously described and reference may be had to the following papers:

(1) A paper by C. B. AIKEN, W. H. CARTER Jr, and F. S. PHILLIPS entitled "The Production of Film Type Bolometers with Rapid Response", published in Rev.Sci.Ins., Vol. 17, No. 10, p. 377, 1946.

(2) A paper by B. H. BILLINGS, W. L. HYDE and E. F. BARR entitled "Construction and Characteristics of Evaporated Nickel Bolometers", Rev.Sci.Ins., Vol. 18, No. 6, p. 429. June 1947.

(3) A paper by K. YOSIHARA entitled "An Investigation of the Properties of Bolometers made by Vacuum Evaporation", Science of Light, Vol. 5, No. 2, p. 29. 1956.

(4) A paper by W. R. BLEVIN and W. J. BROWN entitled "Large-area Bolometers of Evaporated Gold", J.Sci.Ins., Vol. 42, No. 1, p. 19, January 1965.

However, the material properties of these detectors are not optimum, and it is an object of the present invention to improve the detecting ability of devices of this type. The invention deals with the method of preparation and the introduction of new materials technology.

(5) A recent report by GOSCH under the title "Thin Film enhances Bolometer's Sensitivity", published in Electronics, 28 Feb. 1980, page. 75, describes a gold film bolometer which is said to have exceptionally high performance, but the information given is incomplete.

Patents on bolometers are also well known, for example, the patent to R. J. HAVENS et al, U.S. Pat. No. 2,516,873; the patent to J. LEBLANC et al, U.S. Pat. No. 4,116,063; the patent to P. PAUL, U.S. Pat. No. 3,745,360; the patent to B. NORTON et al U.S. Pat. No. 3,202,820; and the patent to E. H. EBERHARDT AVS No. 220,305. However these patents do not describe either the method of preparation or the materials technology which are features of the present invention.

It is further understood that the general concept of a bolometer detector comprised of a thin infrared sensitive film deposited onto a pellicle which is supported over an aperture is described in the patent by R. J. HAVEN et al and in the papers cited above, and consequently is not specifically claimed in the present invention.

The detector according to this invention is comprised essentially of an ultra thin metal film, vaccum deposited on to a thin dielectric or semiconductor pellicle. The pellicle is supported at its edges by a suitable substrate material, on which are formed metal bonding pads. Electrical connection is made between the radiation sensitive detector element and the bonding pads by means of thin metal contacts.

A hole, or alternatively a channel or slot pattern is drilled through or etched into the substrate, and the pellicle is freely-supported over the recess thus formed. A single detector element in a multi-element detector array has the pellicle supported over an etched channel, and a metal film interconnect joins the detector contacts to the bonding pads.

The detector or detector array is mounted inside a microcircuit package fitted with an infrared transmitting window. Depending on the desired performance, the package is either evacuated or filled to a predetermined pressure with a selected gas.

In order however to fully understand the nature of the invention, embodiments thereof will now be described with reference to the accompanying drawings to which however the invention is not necessarily limited.

In the drawings:

FIG. 1 is a schematic plan of a single element metal film bolometer detector according to the invention, FIG. 2 is a side elevation of same, FIG. 3 and FIG. 4 are corresponding views of metal film bolometer detector array.

FIG. 5 gives details showing the form that the substrates can take, showing at A holes, channels and slots formed by diamond drilling, spark erosion, abrasive or laser milling, at B formed by isotropic etch and laser drill venting, at C formed by an anisotropic etch, and at D formed by an anisotropic back-etched substrate.

In the drawings the substrate is designated 5, the pellicle 6, the detector element 7, the thin film contacts 8 and the bonding pads or, as shown in the figures interconnects 9. The holes are designated 10.

In FIGS. 3 and 4 of the drawings is shown how an array can be constructed by linearly extending the substrate 5 and the hole 10 and placing the pellicle 6 over the slot (or slots) thus formed along the length of the substrate.

The substrate can be prepared as follows: Depending on the chosen application and facilities available the substrate material may be an aluminium oxide ceramic, a glass, an insulated metal or a silicon slice. Silicon slices (wafers) are either thermally oxidised or coated with a thin film dielectric material, to provide electrical insulation.

Aluminium oxide (alumina) ceramic substrates are prepared by grinding to the desired shape, and holes for the pellicle are formed with a high speed diamond drill.

Glass substrates are ground and polished and the holes, channels or slots are defined by conventional photolithographic methods, using hydrofluoric acid etchant. Both quartz and borosilicate type glasses may be used.

Metal substrates are prepared by conventional machining techniques, either singly or in large repeated patterns which are subsequently separated. The metals preferred are brass and aluminium. The surface of the metal is polished and coated as appropriate with an insulating layer by means of anodisation, chemical vapour deposition, thermal deposition or sputter deposition. The standard surface coating is sputter deposited silicon dioxide. An insulating polymer coating may be used in some designs.

Polycrystalline or single crystal silicon substrates are furnished with holes, channels or slots by means of conventional photolithography. Both thermal oxide and metal film masks are employed, depending on the etchant. Large numbers of substrates are prepared on a single silicon wafer, using step-and-repeat photographic artwork.

The patterns are etched in silicon substrates with either isotropic or anisotropic etchants, the latter applying to single crystal material having a (1,0,0) or (1,1,0) surface orientation. Good results have been achieved with conventional nitric/hydrofluoric acid isotropic etchants, and a hydrazine anisotropic etchant.

Holes, channels or slots extend through the thickness of the substrate, but where this requirement is not convenient or practicable, laser-drilled venting holes are provided, assisted as required by rear surface etching to reduce the drill depth as shown in FIG. 5B.

It is to be noted that spark erosion, abrasive and laser milling are alternative methods of generating hole or slot patterns in substrate materials, and have been successfully employed for alumina and silicon substrates.

Anisotropic etching of (1,0,0) surface orientation silicon is illustrated in FIG. 5C. The use of an anisotropic rear surface etch for venting purposes is optional to isotropic etching.

A one-step anisotropic rear etch process can be used, as shown in FIG. 5D. It is to be noted that the optional use of (1,1,0) surface orientation silicon results in channels which have vertical side walls.

Which technique should be employed depends on the user's requirements. Thus aluminium oxide, glass or metal substrates are suitable for small batch preparations of single element detectors, whilst silicon substrates are admirably suited to large scale production. Furthermore in the latter case isotropic etchants are adequate or indeed necessary for some applications, whereas anisotropic etchants are preferred for high definition pattern generation.

Bonding pads are applied either by vacuum deposition through precision mechanical masks, or by vacuum deposition and/or electroplating followed by pattern etching using photographic masks. In both cases, large numbers of substrates are processed during a single operation.

When metal film masks are used for hole and slot etching in silicon substrates, the same film may be used for bonding pads, and the substrate then cut to the desired size using a microcircuit dicing saw.

The bonding pad material is either aluminium or gold, depending on the application. Gold film deposition is preceded by deposition of a thin metal bonding and diffusion barrier film (or films), such as chromium or nichrome followed by nickel, or a single layer of tantalum or molybdenem, or either tantalum or titanium followed by platinum.

Three general methods have been devised for pellicle preparation, and are employed optionally to meet the user's applications. In the first of these makes use of a polymer film approximately 50 nm thick, which is solvent cast on a glass surface, then separated on water and collected on a metal or epoxy resin annulus. The polymer membrane is then pressed on to the substrate surface and adhered by directing a humid jet of air on to the membrane surface. This technique is employed for simple, low cost detectors of moderate performance where heat treatment cycles are not required.

The usual polymer material is cellulose nitrate, but numerous materials (notably polyvinyl chloride and polyvinyl formal) have been successfully employed.

Bolometer detectors comprised of a thin film of nickel, gold or bismuth, vacuum deposited on to a cellulose nitrate pellicle have previously been reported, (references 1 to 3); however, the application of polymer pellicles, in conjunction with the above substrate preparation techniques, has not been described.

In the second method, the pellicle is a thin inorganic dielectric or semiconductor film prepared either by anodisation, or by vacuum deposition on to a metal film or polymer membrane. The desired pellicle shape is generated by mechanical or photographic masking techniques and the metal or polymer backing is removed by preferential etching, solvents or (in the case of polymers) either oven stoving or plasma ashing. The dielectric or semiconductor film is usually pressed on to the substrate prior to removal of the backing, but this process is optional and will depend on the individual detector design.

The pellicle is precisely located on the substrate by means of a mechanical alignment jig.

Aluminium oxide, silicon dioxide, silicon monoxide, cryolite, germanium and silicon pellicles have been successfully prepared by this method. The thickness of the pellicles is less than 50 nm, and typically 25 nm for most applications.

Bolometer detectors which employ anodised aluminium oxide pellicles have been described (references 4 and 5); but not as described herein. Nor have pellicle thicknesses less than 50 nm been reported, regardless of the preparation method.

The third and most advanced technique for pellicle preparation is a method by which the pellicle material is deposited by vacuum or chemical vapour deposition techniques anodisation or a plasma-assisted process, directly onto a silicon substrate. Holes, channels or slots are then etched into the rear surface of the silicon wafer, rendering the pellicle freely-supporting.

Silicon nitride, aluminium oxide and elemental silicon film pellicles have been prepared by this method. Note that when the surface of the silicon substrate is provided with an insulator layer, e.g., thermal oxide, this layer must also be removed.

Electrical interconnections and detector contacts are prepared by similar processes described above for bonding pads and in some designs are simple extensions of the bonding pads.

The detector elements are ultra thin films of gold, nickel, palladium, iridium or platinum. Selection depends on the desired application. For the best performance, the high melting point noble metals are preferred. Detailed processing steps also depend on the selected metal. Three methods of preparation are identified. Each method may be used for the manufacture of both single element detectors and detector arrays.

The first method of detector preparation is employed for all high melting point metal detector films, including nickel and palladium, and with inorganic pellicles.

Processed substrates, complete with bonding pads, interconnections, contacts and detector pellicle, are inserted in a deposition jig fitted with a precision micromechanical evaporation mask. The detector elements are deposited through the mask by means of high vacuum thermal evaporation.

Prior to deposition the substrate is thermally outgassed in vacuo. The substrate may also be heated during deposition, but this step is optional and not necessary for some evaporants. The vacuum coating unit should have excellent backstreaming protection and be capable of an ultimate pressure of $1 \times 10^{-4}$ Pa. During deposition, the pressure and deposition rate should be such that the ratio of arrival rate of metal atoms to the impingement rate of residual gas species is large.

Deposition is terminated at a predetermined electrical resistance, measured using a monitor substrate fitted with electrical probes. The film thickness is also monitored during deposition. A brief post deposition bake in vacuo is beneficial for some materials, but is an optional processing step.

Following removal from the vacuum chamber, the detector is annealed in a selected gas. The temperature depends on the particular detector metal, but is typically 250° C. Nickel films are baked in hydrogen and the noble metal films are annealed in air or an inert gas. The annealing process encourages recrystallization, reduces structural defects, and removes impurities, thereby stabilising the electrical resistance and enhancing the temperature coefficient of resistance.

The selected resistance and thickness of the deposited films are characteristics of the individual metal, and the final detector resistance is influenced by the processing parameters. Preparation parameters are chosen to obtain a final sheet resistance in the range 150 to 250 ohm per square, corresponding to the region of maximum infrared absorption, which for metal films is 50%. The thickness is less than 10 nm, and for higher melting point metals such as platinum and iridium the typical thickness is 5 nm.

This method provides for the preparation of bolometer detectors which have optimum electrical, optical and thermophysical properties. Since both the metal film and pellicle are extremely thin, the thermal resistance of the detector is exceptionally high, whilst the thermal capacitance is small. The method thereby produces detectors of high sensitivity, fast speed of response, and flat frequency response characteristic up to the frequency cutoff.

A second optional method for low temperature preparations is mainly employed for lower melting point metals such as gold, and for polymer pellicles. The same equipment described above is used; however the substrate is not heated during processing. The method has also been employed with inorganic dielectric pellicles.

An electrical 'forming' current is applied to the detector element during deposition, and is subsequently maintained until the electrical resistance is stable. Although the resistance is continuously monitored, control of thickness and deposition rate is the major consideration. The desired thickness is a characteristic of the specific metal, and for gold is in the range 15 to 20 nm.

Gold film bolometers have been extensively reported, but the method of attaining optimum detective properties in films less than 20 nm thick, by means of a precise control of thickness and deposition rate in conjunction with a forming current, form part of this invention which relates to improved technology and attainment of optimum material parameters.

In the third method of detector preparation evaporation masks are not used; however preparation parameters, including annealing cycles, are similar to those described above for high melting point metals. The detector element may be deposited by high vacuum thermal evaporation or by sputtering.

The detector metal is deposited onto the surface of a silicon wafer precoated with the desired pellicle material. Detector elements are defined by conventional microcircuit photolithography. Contacts, interconnects and bonding pads are also formed by pattern etching using photographic masks.

By any of the above three methods, detector elements of size ranging from several millimetres to less than 0.05 mm can be fabricated.

Following detector processing, the substrate is rear-etched by the method described earlier herein.

A number of detector or detector arrays are prepared on a single silicon wafer and these are separated using a microcircuit dicing saw, or by rear surface etching.

Processed detectors are mounted in microcircuit packages fitted with vacuum-tight infrared transmitting windows. Electrical connection is made to detectors by conventional microcircuit wire bonding methods.

The final package seal is carried out in vacuo or at a predetermined pressure in a selected gas. Optionally, the package is fitted with an evacuation tube and, after lid sealing, this tube is used to evacuate the package and back-fill with the selected gas. The tube is then pinched off.

A dedicated package sealing system has been constructed which facilitates assembly and sealing of the package components entirely within a vacuum-tight enclosure. This equipment is fitted with outgassing and sealing apparatus, and provision is made for precise control of both temperature and absolute gas pressure. Detector responsivity and speed of response can be monitored during the sealing process.

The range of gases used include nitrogen, argon, Freon 12, Freon 22 and xenon. The control of both pressure and gas type allows the user to trade between detector sensitivity and speed of response, and is an integral component of preparation technique.

Encapsulation of bolometer detectors in vacuo or an inert gas is an established technique. However, the deliberate adjustment of pressure, in conjunction with a selected gas of known thermophysical properties, in order to attain a wide range of detective performance suitable to the user's needs, is a novel development.

The claims defining the invention are claimed as follows:

1. An infrared radiation detector comprising
   (a) a substrate formed of a stable material such as an aluminum oxide ceramic, a glass, a metal having an electrically insulating surface, or a silicon slice, said substrate having a hole therethrough;
   (b) a pair of bonding pads spaced apart one on each side of the said hole;
   (c) a pellicle having a thickness less than 50 nm to have a low heat retaining capacity and high thermal resistance formed of an insulating or semiconductor material selected from the group consisting of aluminium oxide, silicon dioxide, silicon monoxide, silicon nitride, cryolite, germanium, and silicon, positioned to span the said aperture;
   (d) a detector comprised of an essentially straight electrical resistance element fixed on the said pellicle to be positioned over the said hole, and comprising an ultrathin infrared-absorbing film less than 10 nm thick selected to form both the absorber of infrared energy and a resistance element and selected from the group consisting of nickel, palladium, platinum and iridium such metal being selected to have a low heat retaining capacity and high thermal resistance; and
   (e) a pair of thin-film conductive contacts connecting opposite sides of the said detector element to the said bonding pads.

2. An infrared radiation detector according to claim 1 formed as an array of detector elements spaced apart on an elongated pellicle mounted on the said substrate to extend across a series of holes, each detector element being joined to a pair of thin-film interformed connects by a pair of thin-film contacts, each detector of the array and the thin-film contacts and interconnects being electrically isolated from each adjacent detector element.

3. An infrared radiation detector according to claim 1 or 2 wherein the substrate is a ceramic and the said holes are formed by a high speed diamond drill.

4. An infrared radiation detector according to claim 1 or 2 wherein the substrate is glass and the said holes are formed by photolithography using an etchant.

5. An infrared radiation detector according to claim 1 or 2 wherein the substrate is polycrystalline or single crystal silicon, and the said holes are formed by photolithography using an etchant.

6. An infrared radiation detector according to claim 1 or 2 wherein the substrate is metal having a polished surface coated with an insulating layer by anodising.

7. An infrared radiation detector according to claim 1 or 2 wherein the substrate is metal having a polished surface coated with an insulating layer by chemical deposition.

8. An infrared radiation detector according to claim 1 or 2 wherein the substrate is metal having a polished surface coated with an insulating polymer.

9. An infrared radiation detector according to claim 1 or 2 wherein the substrate has the said holes formed in it by spark erosion.

10. An infrared radiation detector according to claim 1 or 2 wherein the substrate has the said holes formed in it by abrasive milling.

11. An infrared radiation detector according to claim 1 or 2 wherein the said detector element prepared by deposition through precision micro-mechanical masks.

12. An infrared radiation detector according to claim 1 or 2 wherein the said detector element prepared by deposition followed by pattern etching using photolithography.

13. A method of producing an infrared radiation detector, which detector comprises a substrate formed of a stable material having a hole therethrough, a pair of bonding pads spaced apart one on each side of the hole, a pellicle having a thickness less than 50 nm formed of an insulating or semiconductor material selected from the group consisting of aluminium oxide, silicon dioxide, silicon monoxide, silicon nitride, cryolite, germanium, and silicon, positioned to span the said aperture, a detector comprised of an electrical resistance element carried on the said pellicle to be positioned over the said hole, and comprising an ultrathin infrared-absorbing film selected from the group consisting of nickel, palladium, platinum, and a pair of thin-film conductive contacts connecting opposite sides of the said detector element to the said bonding pads, said method comprising forming said pellicle by anodising of vacuum deposition on to a backing comprising a metal film of polymer membrane while generating the required shape by masking techniques, pressing said pellicle to the said substrate, and removing said backing.

14. A method of producing an infrared radiation detector, which detector comprises a substrate formed of a stable material having a hole therethrough, a pair of bonding pads spaced apart one on each side of the hole, a pellicle having a thickness less than 50 nm to have a low heat retaining capacity and high thermal resistance formed of an insulating or semiconductor material selected from the group consisting of aluminium oxide, silicon dioxide, silicon monoxide, silicon nitride, cryolite, germanium, and silicon, positioned to span the said aperture, a detector comprised of an electrical resistance element carried on the said pellicle to be positioned over the said hole, and comprising an essentially straight ultrathin infrared-absorbing film less 10 nm thick selected to form both the absorber of infrared energy and a resistance element and selected from the group consisting of nickel, palladium, platinum or iridium, and a pair of thin-film conductive contacts connecting opposite sides of the said detector element to the said bonding pads, said method comprising forming said pellicle by depositing the pellicle material by vacuum or chemical vapour deposition directly onto a silicon substrate and then etching said hole into the rear surface of the silicon wafer whereby to render the pellicle freely-supporting.

15. An infrared radiation detector comprising a substrate formed of a stable material such as an aluminium oxide ceramic, a glass, a metal having an electrically insulating surface, or a silicon slice, said substrate having a hole therethrough; a pair of bonding pads spaced apart one on each side of the said hole; a pellicle having a thickness less than 50 nm to have a low heat retaining capacity and high thermal resistance formed of an insulating or semiconductor material selected from the group consisting of aluminium oxide, silicon dioxide, silicon monoxide, silicon nitride, cryolite, germanium, and silicon, positioned to span the said aperture; a detector comprised of an essentially straight electrical resistance element fixed on the said pellicle to be positioned over the said hole, and comprising an ultrathin infrared-absorbing film selected to form both the absorber of infrared energy and a resistance element and formed of a gold film less than 20 nm thick having a low heat retaining capacity and high thermal resistance; and a pair of thin-film conductive contacts connecting opposite sides of the said detector element to the said bonding pads.

16. A method of producing an infrared radiation detector, which detector comprises a substrate formed of a stable material having a hole therethrough, a pair of bonding pads spaced apart one on each side of the hole, a pellicle having a thickness less than 50 nm to have a low heat retaining capacity and high thermal resistance formed of an insulating or semiconductor material selected from the group consisting of aluminium oxide, silicon dioxide, silicon monoxide, silicon nitride, cryolite, germanium, and silicon, positioned to span the said aperture, a detector comprised of an essentially straight electrical resistance element fixed on the said pellicle to be positioned over the said hole, and comprising an ultrathin infrared-absorbing film selected to both the absorber of infrared energy and a resistance element and formed of a gold film less than 20 nm thick, an a pair of thin-film conductive contacts connecting opposite sides of the said detector element to the said bonding pads, said method comprising forming said pellicle by anodizing or vacuum deposition onto a backing comprising a metal film or polymer membrane while generating the required shape by masking techniques, pressing said pellicle to the said substrate, and removing said backing.

17. A method of producing an infrared radiation detector, which detector comprises a substrate formed of a stable material having a hole therethrough, a pair of bonding pads spaced apart one one each side of the hole, a pellicle having a thickness less than 50 nm to have a low heat retaining capacity and high thermal resistance formed of an insulating or semiconductor material selected from the group consisting of aluminium oxide, silicon dioxide, silicon monoxide, silicon nitride, cryolite, germanium, and silicon, positioned to span the said aperture, a detector comprises of an essentially straight electrical resistance element carried on the said pellicle to be positioned over the said hole, and comprising an ultrathin infrared-absorbing film selected to from both the absorber of infrared energy and a resistance element and formed of a gold film less than 20 nm thick, and a pair of thin-film conductive contacts connecting opposite sides of the said detector element to the said bonding pads, said method comprising forming said pellicle by depositing the pellicle material by a vacuum or chemical vapour deposition directly onto a silicon substrate and then etching said hole into the rear surface of the silicon wafer whereby to render the pellicle freely-supporting.

* * * * *